United States Patent
Wichowski et al.

(10) Patent No.: US 11,630,748 B2
(45) Date of Patent: Apr. 18, 2023

(54) RECONFIGURABLE STAND ALONE DISTRIBUTED SYSTEM MOTOR CONTROLLERS

(71) Applicant: Hamilton Sundstrand Corporation, Charlotte, NC (US)

(72) Inventors: Robert P. Wichowski, Westfield, MA (US); Timothy A. Roberts, Enfield, CT (US); Patrick J. Sears, South Hadley, MA (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 1057 days.

(21) Appl. No.: 16/365,931

(22) Filed: Mar. 27, 2019

(65) Prior Publication Data

US 2020/0310936 A1 Oct. 1, 2020

(51) Int. Cl.
| | |
|---|---|
| *G06F 11/30* | (2006.01) |
| *G06F 16/901* | (2019.01) |
| *G06F 30/34* | (2020.01) |
| *B64G 1/52* | (2006.01) |
| *G05B 7/02* | (2006.01) |
| *H01L 23/552* | (2006.01) |

(52) U.S. Cl.
CPC ............ *G06F 11/3013* (2013.01); *B64G 1/52* (2013.01); *G05B 7/02* (2013.01); *G06F 16/9017* (2019.01); *G06F 30/34* (2020.01); *H01L 23/552* (2013.01)

(58) Field of Classification Search
CPC .. G06F 11/3013; G06F 16/9017; G06F 30/34; G06F 15/7867; B64G 1/52; G05B 7/02; G05B 2219/21109; G05B 19/0426; H01L 23/552
See application file for complete search history.

(56) References Cited

U.S. PATENT DOCUMENTS

| | | |
|---|---|---|
| 6,260,139 B1 | 7/2001 | Alfke |
| 7,793,147 B2 | 9/2010 | Stange et al. |
| 8,156,251 B1 | 4/2012 | Sorensen et al. |

(Continued)

FOREIGN PATENT DOCUMENTS

| | | | |
|---|---|---|---|
| EP | 2770628 A2 * | 8/2014 | ............ H02P 6/182 |
| EP | 2770628 A2 | 8/2014 | |

(Continued)

OTHER PUBLICATIONS

European Search Report; European Application No. 19211297.7; Filed: Nov. 25, 2019; dated Jun. 8, 2020; 8 pages.

*Primary Examiner* — Farley Abad (74) *Attorney, Agent, or Firm* — Cantor Colburn LLP (57) ABSTRACT

Methods and systems for operating internal systems of a vehicle are provided. Aspects include providing a field programmable gate array (FPGA), the FPGA including a communication channel port, wherein the communication channel port is operable to connect to one or more systems through a communication channel, and wherein the FPGA is configured to operate in one or more control modes, receiving a communication channel input to the communication channel port of the FPGA, based at least in part on the communication channel input, determining a control mode from the one or more control modes, and operating the FPGA in the control mode, wherein the control mode is associated with one system of the one or more systems.

14 Claims, 4 Drawing Sheets

(56) References Cited

U.S. PATENT DOCUMENTS

| | | |
|---|---|---|
| 9,552,271 B1 | 1/2017 | Fetta et al. |
| 2006/0006646 A1 * | 1/2006 | Rich ................. B29C 66/12841 |
| | | 285/288.1 |
| 2012/0054483 A1 * | 3/2012 | Haaf .................... G06F 9/4403 |
| | | 713/2 |
| 2012/0134783 A1 * | 5/2012 | Davidson ............. F04D 29/321 |
| | | 415/148 |
| 2014/0273856 A1 * | 9/2014 | Kyles ....................... H04B 5/02 |
| | | 455/41.2 |
| 2017/0066335 A1 | 3/2017 | Verghese et al. |

FOREIGN PATENT DOCUMENTS

| | | | | |
|---|---|---|---|---|
| WO | WO-2004109966 A2 * | 12/2004 | .......... | H04W 40/246 |
| WO | 2007115600 A1 | 10/2007 | | |
| WO | WO-2013100909 A1 * | 7/2013 | ........... | G06F 1/3275 |
| WO | WO-2017030703 A1 * | 2/2017 | ........... | G06F 13/385 |

\* cited by examiner

RECONFIGURABLE STAND ALONE DISTRIBUTED SYSTEM MOTOR CONTROLLERS

BACKGROUND

The invention relates generally to controllers, and more particularly, to a reconfigurable field programmable gate array (FPGA) based stand-alone distributed system controllers for spacecraft safety.

Vehicles such as aircraft and spacecraft each incorporate numerous different systems including critical and non-critical systems. Critical systems include systems such as, for example, life support systems. Because of economy of space, these systems are often deeply embedded within various assemblies that form the vehicle. As such, because access is limited due to the spacecraft's design, the system components are difficult to access when failures occur. Moreover, the motors used in spacecraft assemblies are hardened in order to survive in a high radiation environment. These motors that are deeply embedded within a vehicle assembly are of the cause when failures occur in a system. For critical systems, these failures would need to be addressed quickly but that is not possible with current systems. What is needed is the ability to utilize system components from non-critical systems to quickly interchange with system components from critical systems that have failed.

SUMMARY

According to a non-limiting embodiment, a method for operating an internal system in a vehicle is provided. The method includes providing a field programmable gate array (FPGA), the FPGA including a communication channel port, wherein the communication channel port is operable to connect to one or more systems through a communication channel, and wherein the FPGA is configured to operate in one or more control modes, receiving a communication channel input to the communication channel port of the FPGA, based at least in part on the communication channel input, determining a control mode from the one or more control modes, and operating the FPGA in the control mode, wherein the control mode is associated with one system of the one or more systems.

In addition to one or more of the features described above, or as an alternative, further embodiments of the method may include receiving a second communication channel input to the communication channel port of the FPGA, based at least in part on the communication channel input, determining a second control mode from the one or more control modes, and operating the FPGA in the second control mode.

In addition to one or more of the features described above, or as an alternative, further embodiments of the method may include that the communication channel port comprises a plurality of pin inputs.

In addition to one or more of the features described above, or as an alternative, further embodiments of the method may include that the communication channel input comprises a plurality of pin connectors.

In addition to one or more of the features described above, or as an alternative, further embodiments of the method may include that determining the control mode from the one or more control modes comprises analyzing a configuration of the plurality of pin connectors, mapping the configuration of the plurality of pin connectors to a binary number, and comparing the binary number to a look-up table stored in a memory associated with the FPGA to determine the control mode.

In addition to one or more of the features described above, or as an alternative, further embodiments of the method may include that the one or more control modes comprise a plurality of operation parameters for the one or more system.

In addition to one or more of the features described above, or as an alternative, further embodiments of the method may include that the plurality of operation parameters comprise gain, shutdown control, and speed settings for the one or more systems.

In addition to one or more of the features described above, or as an alternative, further embodiments of the method may include that the one or more control modes comprise an FPGA designation.

In addition to one or more of the features described above, or as an alternative, further embodiments of the method may include that the FPGA designation comprises a primary designation, a secondary designation, and a tertiary designation.

In addition to one or more of the features described above, or as an alternative, further embodiments of the method may include that the one system of the one or more systems comprises an internal system of a vehicle.

In addition to one or more of the features described above, or as an alternative, further embodiments of the method may include that the vehicle is a spacecraft and the internal system within the vehicle are hardened against a radiation environment.

According to another non-limiting embodiment, a system is provided. The system includes a field programmable gate array (FPGA) including a communication channel port, the communication channel port operable to connect to one or more systems through a communication channel, wherein the FPGA is configured to operate in one or more control modes and wherein the FPGA is configured to receive, at the communication channel port, a communication channel input, determine a control mode from the one or more control modes based at least in part on the communication channel input, and operate in the control mode, wherein the control mode is associated with one system of the one or more systems.

In addition to one or more of the features described above, or as an alternative, further embodiments of the system may include that the FPGA is further configured to receive a second communication channel input to the communication channel port of the FPGA, determine a second control mode from the one or more control modes based at least in part on the second communication channel input, and operate in the second control mode.

In addition to one or more of the features described above, or as an alternative, further embodiments of the system may include that the communication channel port comprises a plurality of pin inputs.

In addition to one or more of the features described above, or as an alternative, further embodiments of the system may include that the communication channel input comprises a plurality of pin connectors.

In addition to one or more of the features described above, or as an alternative, further embodiments of the system may include that determining the control mode from the one or more control modes comprises analyzing a configuration of the plurality of pin connectors, mapping the configuration of the plurality of pin connectors to a binary number, and comparing the binary number to a look-up table stored in a memory associated with the FPGA to determine the control mode.

In addition to one or more of the features described above, or as an alternative, further embodiments of the system may include that the one or more control modes comprise a plurality of operation parameters for the one or more system.

In addition to one or more of the features described above, or as an alternative, further embodiments of the system may include that the plurality of operation parameters comprise gain, shutdown control, and speed settings for the one or more systems.

In addition to one or more of the features described above, or as an alternative, further embodiments of the system may include that the one or more control modes comprise an FPGA designation In addition to one or more of the features described above, or as an alternative, further embodiments of the system may include that the FPGA designation comprises a primary designation, a secondary designation, and a tertiary designation.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings, in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

Figure 1:
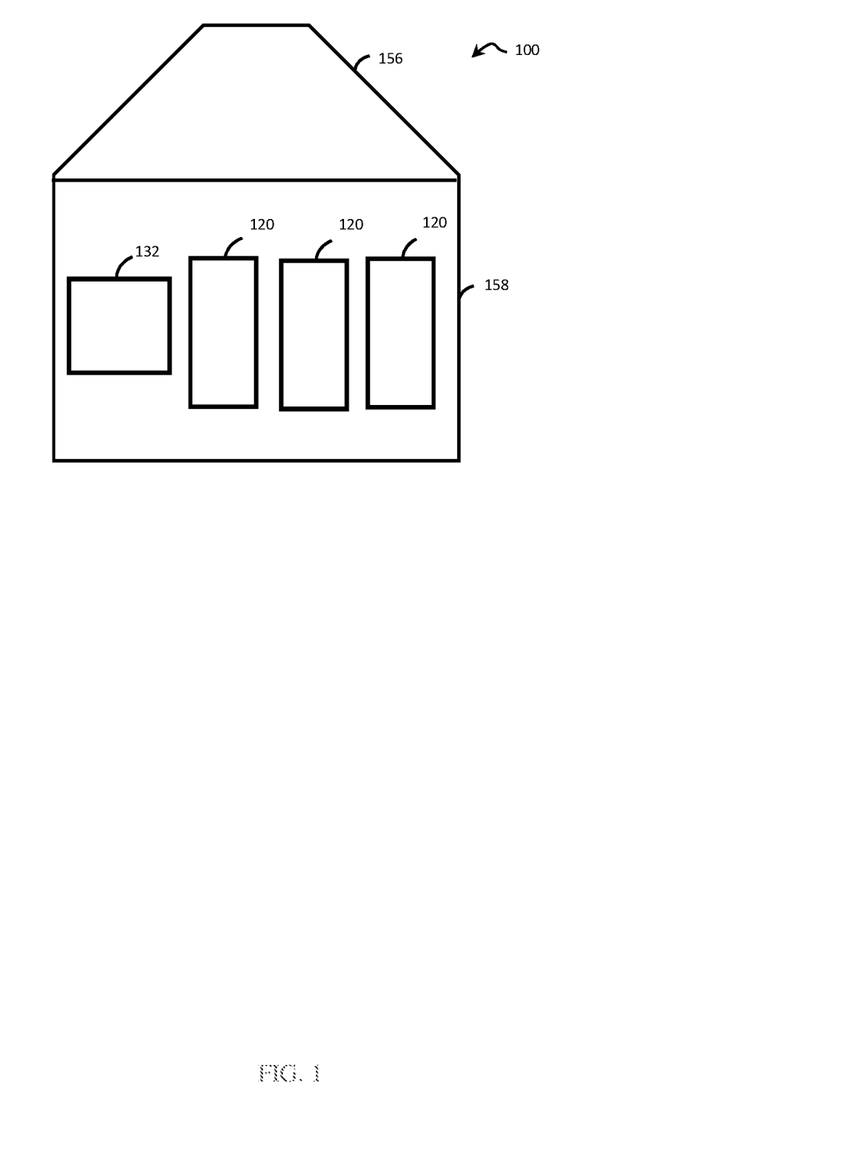
FIG. 1 depicts an exemplary embodiment of a spacecraft having a system control and a plurality of interior systems for a space environment according to one or more embodiments of the present disclosure.

Referring to FIG. 1, there is shown an embodiment illustrating a vehicle which may be any type of vehicle such as, for example, aircraft, spacecraft, space station, satellite, land vehicles and marine vehicles used while implementing the teachings herein. For explanation purposes, the vehicle is hereinafter simply referred to as a spacecraft 100. However, the teachings herein are not to be limited to only spacecraft.

In one or more embodiments, the spacecraft 100 is configured from multiple pre-constructed assemblies such as assemblies 156, 158 shown in FIG. 1. Although the spacecraft 100 is depicted as having only the two assemblies 156, 158, any number of assemblies may be utilized to configure a vehicle such as the spacecraft 100. Each of the assemblies is manufactured to include one or more interior systems. For example, in FIG. 1 the assembly 158 includes interior systems 120. However, each assembly may have any number of interior systems 120. An interior system 120 can be, for example, a life support system, air revitalization system, pressure control system, and the like. Each system may include, for example, various subsystems depending on the intended function such as controllers, processors, fans, actuators, valves, regulators, motors, generators, heat exchangers, carbon dioxide removal systems, trace contaminant control, smoke detectors and the like. Depending on the type of vehicle, such as a spacecraft or space station, the interior systems and subsystems may be hardened against radiation so that they may function and survive within a radiation environment.

Figure 3:
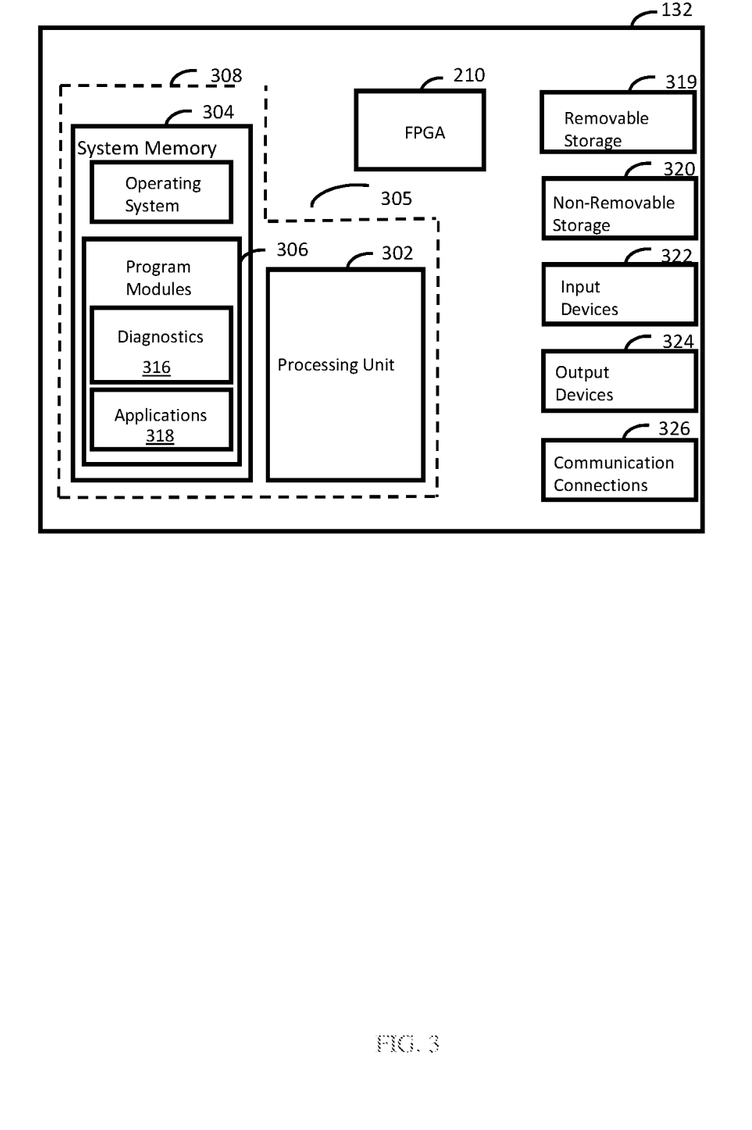
FIG. 3 depicts a block diagram illustrating an exemplary control system that may be utilized to implement one or more embodiments of the present invention.

Still referring to FIG. 1, the spacecraft 100 also includes a system control 132 for monitoring and managing the operation and behavior of the spacecraft 100 as well as the interior systems 120. In particular, the system control 132 receives telemetry data from the spacecraft 100 which it uses to monitor the spacecraft's health. The telemetry data contains sampled data to provide information about its internal systems 120. The system control 132 is a computerized system similar to a general-purpose computing system that is radiation hardened and that is allocated with mission and internal system requirements which define the system control's operational modes and states. FIG. 3 illustrates an exemplary embodiment of the physical components (i.e., hardware) of the control system 132.

Figure 2:
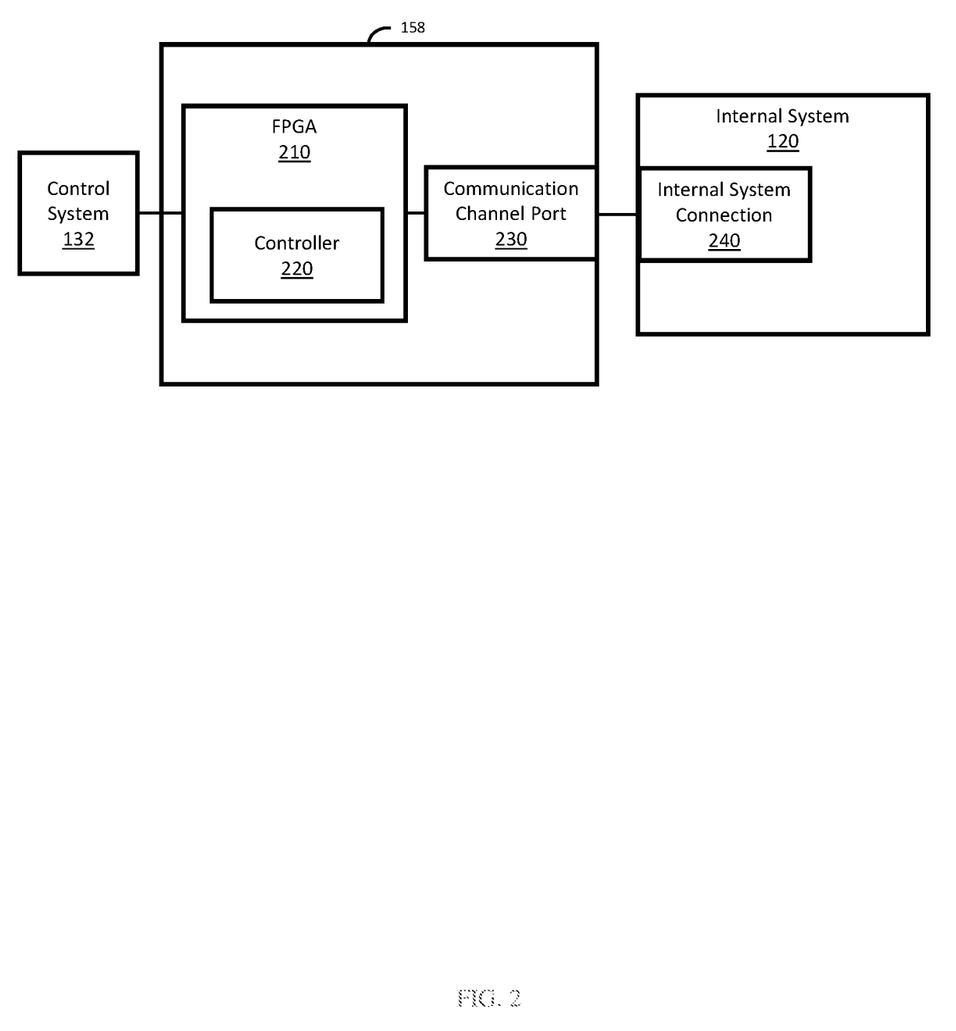
FIG. 2 depicts a field programmable gate array (FPGA) based diagnostic circuitry for operating an internal system in a vehicle according to one or more embodiments of the present invention.

FIG. 2 depicts a field programmable gate array (FPGA) for a space environment for implementing one or more embodiments of the teachings herein. An assembly 158 of a vehicle, for example the spacecraft 100, includes the FPGA 210. The FPGA 210 includes programmable circuitry for providing one or more controllers 220. Each controller 220 is configured to control at least one internal system 120 such as, for example, the life support system within the space craft 100. In one or more embodiments, the FPGA 210 includes a communication channel port 230 that is configured to receive a communication channel input for at least one internal system 120. The FPGA 210 is operable to control and operate an internal system 120. Often internal systems 120, within a spacecraft in particular, can be classified as critical and non-critical systems. Embodiments herein provide an FPGA 210 and assembly 158 that is configured to provide control and operation to any of the internal systems 120 in a spacecraft. That is to say, if an FPGA 210 from one system malfunctions, an FPGA 210 from another system can be swapped in to operate that new system with little crew training. The FPGA 210 can be programmed with multiple control modes for operation of each internal system 120 within a spacecraft. These control modes can be stored on an internal memory associated with the FPGA 210. The FPGA 210 can determine what control mode to operate in based on the communication channel input to the communication channel port 230.

In one or more embodiments, the communication channel port 230 can include multiple pin inputs. The pin input is operable to receive pin connectors from an internal system to operate as a communication channel between the FPGA 210 and the internal system 120. The configuration of the pin inputs can be utilized to determine the control mode for the FPGA 210. That is to say, these pin inputs determine what type of system the internal system 120 is and what is needed to operate the system (i.e., operation parameters). The pin inputs can be configured to have one or more regions of pins coming from the internal system connection 240. One of the regions can be utilized as a communication channel while another region can be used as a system identification. For example, if the pin inputs include a region with a potential for 8 pins. The presents of a pin in this region can be considered a binary '1' while the absence of the pin can be considered a binary '0.' The configuration (e.g., presence and absence) can mapped to a binary number. In this example, up to 256 configurations can be realized and mapped to 256 numbers. The FPGA 210 can compare this binary number to a lookup table stored in a memory to determine the type of system and the control mode to operate in for the internal system 120. The control mode can include operation parameters such as, for example, gain, shutdown control, and speed settings for any electronic motors or other components in the internal system 120. In addition, the control mode can include a designation for the controller 220 to be designated as a primary, secondary, or tertiary controller for operation of the internal system. The designation of primary/secondary/tertiary determines how the FPGA controls the system. For example, in some cases a FPGA that is designated as primary operates the system unless there is a failure that causes shutdown and the secondary monitors the system and only operates once it detects the primary has shut down to provide redundancy. In one or more embodiments, the assembly 158 along with the FPGA 210 and other components can be radiation hardened.

Referring to FIG. 3, an embodiment illustrating physical components of the control system 132 is shown. In a basic configuration, the control system 132 includes at least one processing unit 302 and a system memory 304. According to an aspect, depending on the configuration and type of control system 132, the system memory 304 comprises, but is not limited to, volatile storage (e.g., random access memory), non-volatile storage (e.g., read-only memory), flash memory, or any combination of such memories. According to an aspect, the system memory 304 includes an operating system 305 and one or more program modules 306 suitable for running software applications 318. According to an aspect, the system memory 304 includes a diagnostic module 316 for providing diagnostic information via a diagnostic interface of the FPGA 210. The operating system 305, for example, is suitable for controlling the operation of the control system 132. In one or more embodiments, diagnostics module 316 can initiate via the FPGA 210 performance modeling of the functioning of one or more interior systems 140. Moreover, upon the diagnostics module 316 detecting a failure, the system control 132 can issue a notification to the FPGA 210 indicating the failure.

Furthermore, aspects are practiced in conjunction with a graphics library, other operating systems, or any other application program, and is not limited to any particular application or system. This basic configuration is illustrated in FIG. 3 by those components within a dashed line 308. According to an aspect, the control system 132 has additional features or functionality. For example, according to an aspect, the control system 132 includes additional data storage devices (removable and/or non-removable) such as, for example, magnetic disks, optical disks, or tape. Such additional storage is illustrated in FIG. 3 by a removable storage device 319 and a non-removable storage device 320.

As stated above, according to an aspect, a number of program modules and data files are stored in the system memory 304. While executing on the processing unit 302, the program modules 306 (e.g., diagnostics module 316) perform processes including, but not limited to, one or more of the stages or steps of the method 400 illustrated in FIG. 4. According to an aspect, other program modules are also used.

According to an aspect, the control system 132 has one or more input device(s) 322 such as a keyboard, a mouse, a pen, a sound input device, a touch input device, etc. In one or more embodiments, the input device may be a recorder receiving a video feed from one or more video cameras. The output device(s) 324 such as a display, speakers, a printer, etc. are also included according to an aspect. The aforementioned devices are examples and others may be used. According to an aspect, the control system 132 includes one or more communication connections 326 allowing communications with ground control and other computing devices. Examples of suitable communication connections 326 include, but are not limited to, radio frequency (RF) transmitter, receiver, and/or transceiver circuitry; universal serial bus (USB), parallel, and/or serial ports.

In one or more embodiments, the control system 132 can connect to the FPGA 210 to provide any software based reconfigurations or updates as necessary.

Figure 4:
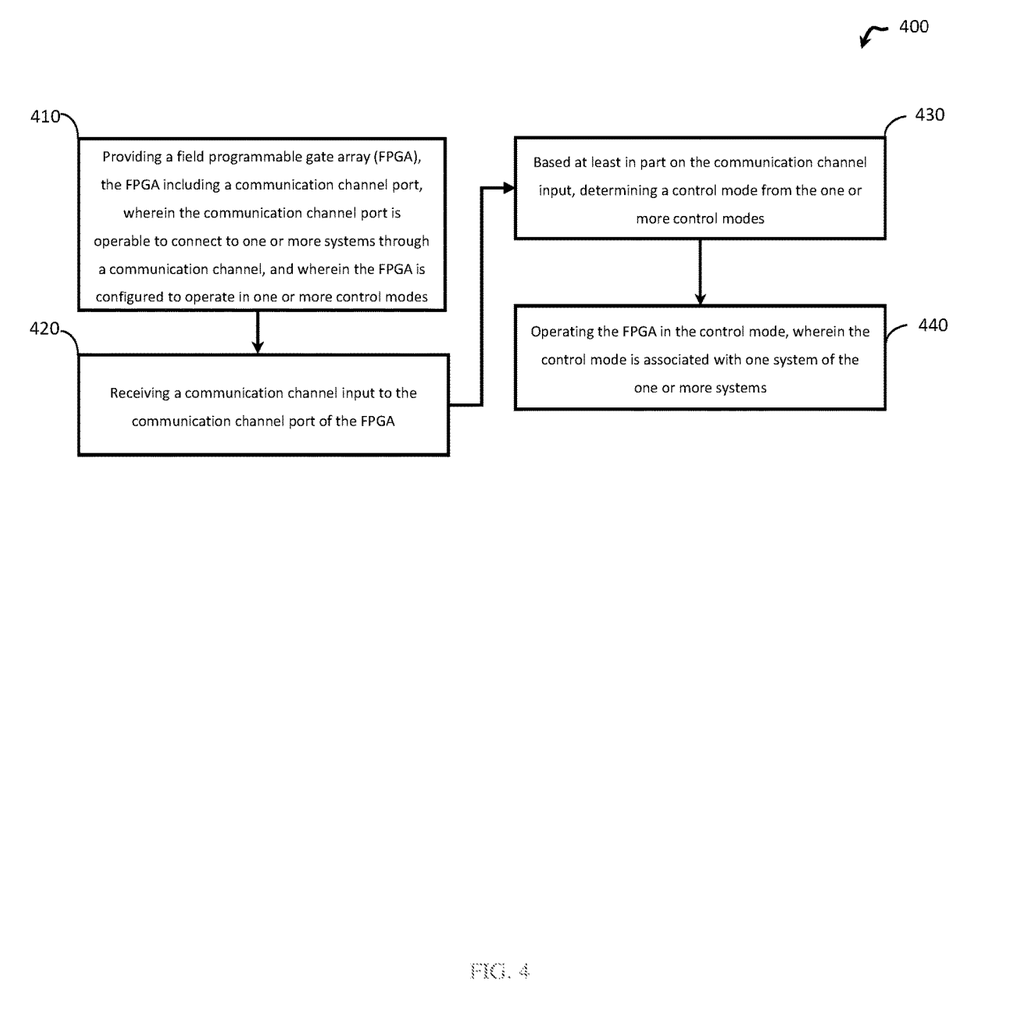
FIG. 4 is a flow diagram illustrating a method of operating an internal system in a vehicle according to one or more embodiments of the present invention.

Turning to FIG. 4, one or more embodiments may include a method 400 for operating an internal system in a vehicle. The method 400 includes providing a field programmable gate array (FPGA), the FPGA (210 from FIG. 2) including a communication channel port (230), wherein the communication channel port (230) is operable to connect to one or more systems through a communication channel, and wherein the FPGA (210) is configured to operate in one or more control modes, as shown in block 410. At block 420, the method 400 includes receiving a communication channel input (240) to the communication channel port (230) of the FPGA (210). Also, at block 430, the method 400 include based at least in part on the communication channel input, determining a control mode from the one or more control modes. And at block 440, the method 400 includes operating the FPGA in the control mode, wherein the control mode is associated with one system (120) of the one or more systems.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. Accordingly, in the interest of brevity, many conventional implementation details are only mentioned briefly herein or are omitted entirely without providing the well-known system and/or process details.

What is claimed is:

1. A method comprising:
providing a field programmable gate array (FPGA), the FPGA including a communication channel port, wherein the communication channel port that includes a plurality of pin inputs operable to connect to one or more systems having a pin connectors, and
wherein the FPGA is configured to operate in one or more control;
receiving a communication channel input from a first system of the one or more system via the pin connectors at the plurality of pin inputs of the communication channel port of the FPGA;
based at least in part on the communication channel input, determining a first control mode from the one or more control modes; and
operating the FPGA in the first control mode, wherein the first control mode is associated with one system of the one or more systems;
wherein determining the first control mode from the one or more control modes comprises analyzing a configuration of the pin connectors, wherein the configuration is based on a presence or absence of pin connectors of the first system;
mapping the configuration of the pin connectors to a binary number; and
comparing the binary number to a look-up table stored in a memory associated with the FPGA to determine the first control mode.

2. The method of claim 1 further comprising:
receiving a second communication channel input to the communication channel port of the FPGA;
based at least in part on the communication channel input, determining a second control mode from the one or more control modes; and
operating the FPGA in the second control mode.

3. The method of claim 1, wherein the one or more control modes comprise a plurality of operation parameters for the one or more systems.

4. The method of claim 3, wherein the plurality of operation parameters comprise gain, shutdown control, and speed settings for the one or more systems.

5. The method of claim 1, wherein the one or more control modes comprise an FPGA designation.

6. The method of claim 5, wherein the FPGA designation comprises a primary designation, a secondary designation, and a tertiary designation.

7. The method of claim 1, wherein the one system of the one or more systems comprises an internal system of a vehicle.

8. The method of claim 7, wherein the vehicle is a spacecraft and the internal system within the vehicle is hardened against a radiation environment.

9. A system comprising:
a field programmable gate array (FPGA) including a communication channel port, the communication channel port operable to connect to one or more systems through a communication channel, wherein the FPGA is configured to operate in one or more control modes; and
wherein the FPGA is configured to:
receive, at the communication channel port, a communication channel input;
determine a first control mode from the one or more control modes based at least in part on the communication channel input; and
operate in the first control mode, wherein the control mode is associated with one system of the one or more systems;
wherein the communication channel port comprises a plurality of pin inputs;
wherein the communication channel input comprises a plurality of pin connectors;
wherein determining the first control mode from the one or more control modes comprises analyzing a configuration of the plurality of pin connectors, wherein the configuration is based on a presence or absence of the plurality of pin connectors;
mapping the configuration of the plurality of pin connectors to a binary number; and comparing the binary number to a look-up table stored in a memory associated with the FPGA to determine the first control mode.

10. The system of claim 9, wherein the FPGA is further configured to:
receive a second communication channel input to the communication channel port of the FPGA;
determine a second control mode from the one or more control modes based at least in part on the second communication channel input; and
operate in the second control mode.

11. The system of claim 9, wherein the one or more control modes comprise a plurality of operation parameters for the one or more systems.

12. The system of claim 11, wherein the plurality of operation parameters comprise gain, shutdown control, and speed settings for the one or more systems.

13. The system of claim 9, wherein the one or more control modes comprise an FPGA designation.

14. The system of claim 13, wherein the FPGA designation comprises a primary designation, a secondary designation, and a tertiary designation.

\* \* \* \* \*